(12) United States Patent
Hwu et al.

(10) Patent No.: US 10,510,837 B2
(45) Date of Patent: Dec. 17, 2019

(54) SYSTEMS AND METHODS FOR FORMING NANOWIRES USING ANODIC OXIDATION

(71) Applicants: TAIWAN SEMICONDUCTOR MANUFACTURING COMPANY LIMITED, Hsinchu (TW); NATIONAL TAIWAN UNIVERSITY, Taipei (TW)

(72) Inventors: Jenn-Gwo Hwu, Taipei (TW); Wei-Cheng Tian, Taipei (TW); Po-Hao Tseng, Taichung (TW)

(73) Assignees: Taiwan Semiconductor Manufacturing Company Limited, Hsinchu (TW); National Taiwan University, Taipei (TW)

( * ) Notice: Subject to any disclaimer, the term of this patent is extended or adjusted under 35 U.S.C. 154(b) by 0 days.

(21) Appl. No.: 15/373,723

(22) Filed: Dec. 9, 2016

(65) Prior Publication Data

US 2017/0092720 A1    Mar. 30, 2017

Related U.S. Application Data

(62) Division of application No. 14/315,421, filed on Jun. 26, 2014, now Pat. No. 9,528,194.

(Continued)

(51) Int. Cl.
*C25D 5/02* (2006.01)
*C25D 7/06* (2006.01)
*C25D 9/06* (2006.01)
*B82Y 10/00* (2011.01)
*B82Y 40/00* (2011.01)

(Continued)

(52) U.S. Cl.
CPC .......... *H01L 29/0673* (2013.01); *B82Y 10/00* (2013.01); *B82Y 40/00* (2013.01); *C25D 5/02* (2013.01); *C25D 7/0607* (2013.01); *C25D 9/06* (2013.01); *C25D 11/005* (2013.01); *C25D 11/32* (2013.01); *H01L 29/401* (2013.01); *H01L 29/42364* (2013.01); *H01L 29/42372* (2013.01); *H01L 29/42392* (2013.01);

(Continued)

(58) Field of Classification Search
CPC .......... H01L 29/0673; H01L 29/78696; H01L 21/02258; H01L 29/775; H01L 29/42372; H01L 29/42364; H01L 29/401; H01L 29/42392; H01L 21/02603; C25D 11/005; C25D 17/005; C25D 17/001; C25D 17/06; C25D 11/022; C25D 7/0607; C25D 11/32; C25D 5/02; C25D 9/06; B82Y 40/00; B82Y 10/00
See application file for complete search history.

(56) References Cited

U.S. PATENT DOCUMENTS 5,134,457 A    7/1992  Hamdy et al.
5,650,338 A    7/1997  Yamazaki et al.
(Continued)

*Primary Examiner* — Steven H Loke
*Assistant Examiner* — Juanita B Rhodes
(74) *Attorney, Agent, or Firm* — Slater Matsil, LLP

(57) ABSTRACT

Structures, devices and methods are provided for forming nanowires on a substrate. A first protruding structure is formed on a substrate. The first protruding structure is placed in an electrolytic solution. Anodic oxidation is performed using the substrate as part of an anode electrode. One or more nanowires are formed in the protruding structure. The nanowires are surrounded by a first dielectric material formed during the anodic oxidation.

20 Claims, 16 Drawing Sheets

Related U.S. Application Data

(60) Provisional application No. 61/972,462, filed on Mar. 31, 2014.

(51) Int. Cl.
| | | |
|---|---|---|
| C25D 11/00 | (2006.01) | |
| C25D 11/02 | (2006.01) | |
| C25D 11/32 | (2006.01) | |
| C25D 17/00 | (2006.01) | |
| C25D 17/06 | (2006.01) | |
| H01L 21/02 | (2006.01) | |
| H01L 29/06 | (2006.01) | |
| H01L 29/40 | (2006.01) | |
| H01L 29/423 | (2006.01) | |
| H01L 29/786 | (2006.01) | |
| H01L 29/775 | (2006.01) | |

(52) U.S. Cl.
CPC ...... *H01L 29/775* (2013.01); *H01L 29/78696* (2013.01); *H01L 21/02603* (2013.01)

(56) References Cited

U.S. PATENT DOCUMENTS

| | | |
|---|---|---|
| 6,613,697 B1 | 9/2003 | Faur et al. |
| 2003/0008473 A1 | 1/2003 | Sakaguchi et al. |
| 2004/0033339 A1 | 2/2004 | Fukutani et al. |
| 2006/0128071 A1 | 6/2006 | Rankin et al. |
| 2006/0216897 A1* | 9/2006 | Lee ............ B82Y 10/00 438/282 |
| 2007/0032076 A1 | 2/2007 | Lee et al. |
| 2007/0069241 A1 | 3/2007 | Yang et al. |
| 2007/0148815 A1 | 6/2007 | Chao et al. |
| 2008/0009105 A1 | 1/2008 | Herner |
| 2008/0017934 A1* | 1/2008 | Kim ............ H01L 29/0657 257/401 |
| 2008/0135949 A1* | 6/2008 | Lo ............ B82Y 10/00 257/401 |
| 2008/0211060 A1 | 9/2008 | Chang et al. |
| 2009/0108252 A1 | 4/2009 | Banerjee et al. |
| 2010/0187660 A1 | 7/2010 | Tang et al. |
| 2011/0213144 A1 | 9/2011 | Kobayashi et al. |
| 2011/0284820 A1 | 11/2011 | Kudera et al. |
| 2011/0300693 A1* | 12/2011 | Oh ............ H01L 21/84 438/479 |
| 2012/0024719 A1 | 2/2012 | Botte |
| 2012/0146053 A1* | 6/2012 | Saitoh ............ H01L 29/66795 257/77 |
| 2012/0228694 A1 | 9/2012 | Shimizu et al. |
| 2012/0282743 A1* | 11/2012 | Saitoh ............ H01L 21/845 438/152 |
| 2013/0148409 A1 | 6/2013 | Chung |
| 2013/0161756 A1* | 6/2013 | Glass ............ H01L 29/66545 257/369 |
| 2014/0197130 A1 | 7/2014 | Lemke et al. |
| 2014/0241493 A1 | 8/2014 | Yokoyama |
| 2015/0311286 A1* | 10/2015 | Lee ............ H01L 29/1033 257/351 |
| 2015/0325481 A1 | 11/2015 | Radosavljevic et al. |

\* cited by examiner

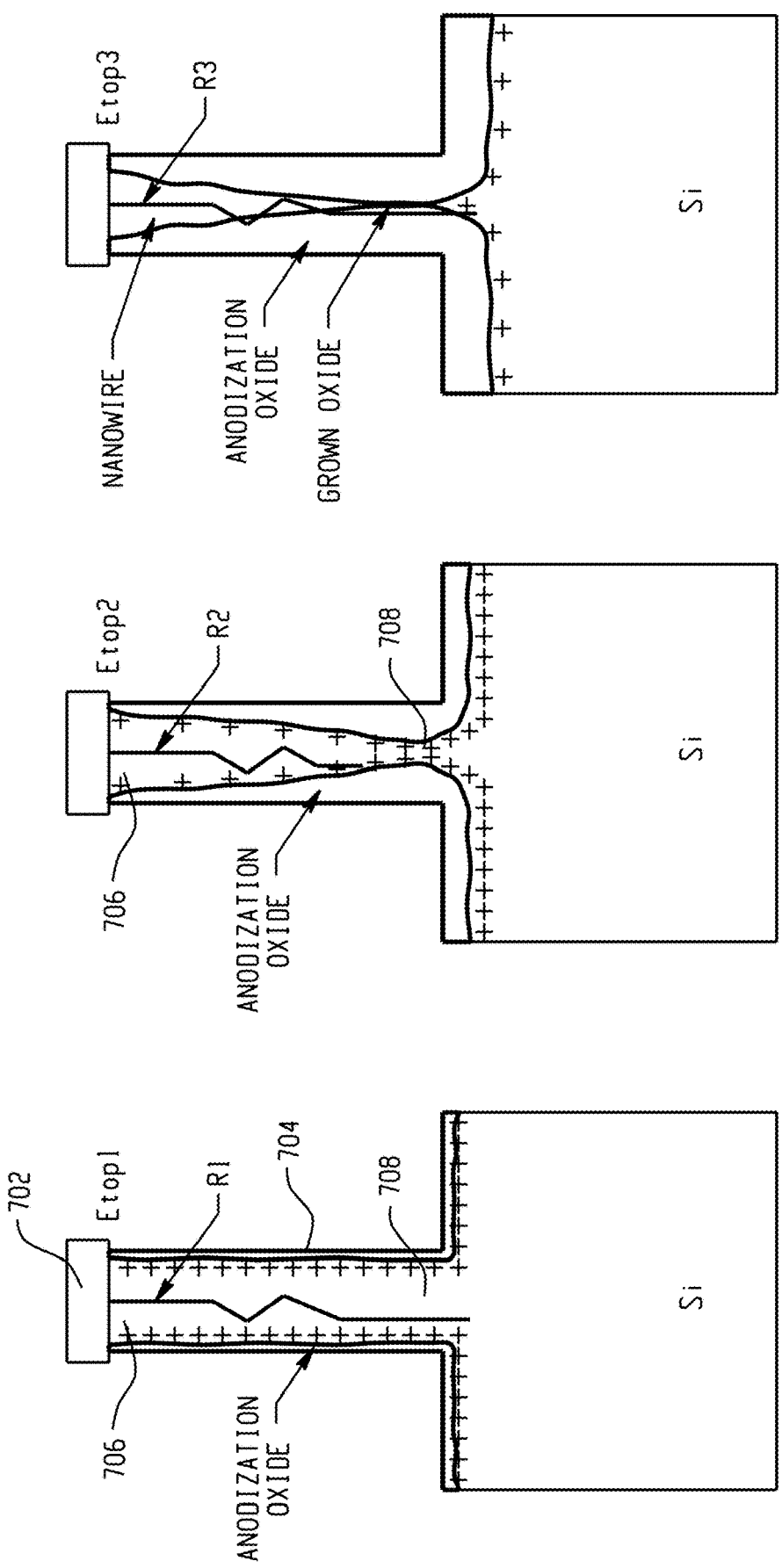

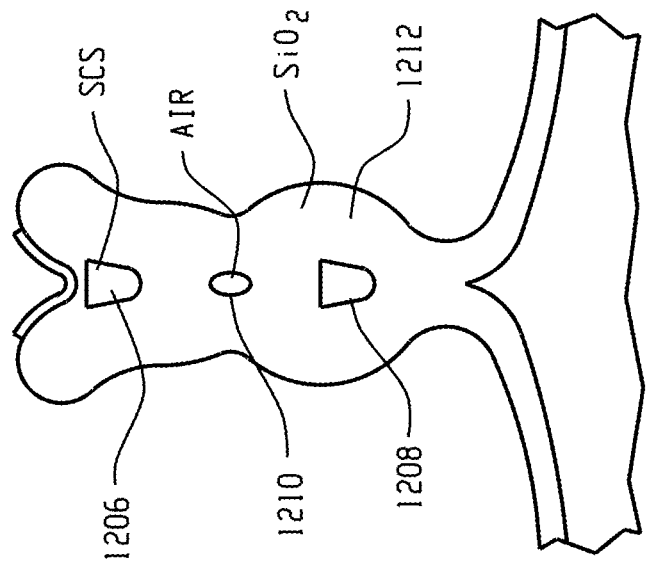
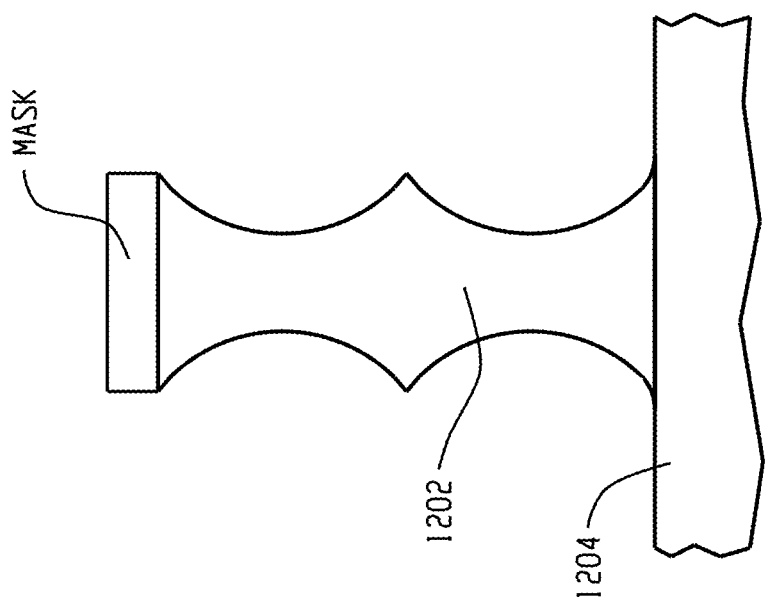
Fig. 12(A)
Fig. 12(B)

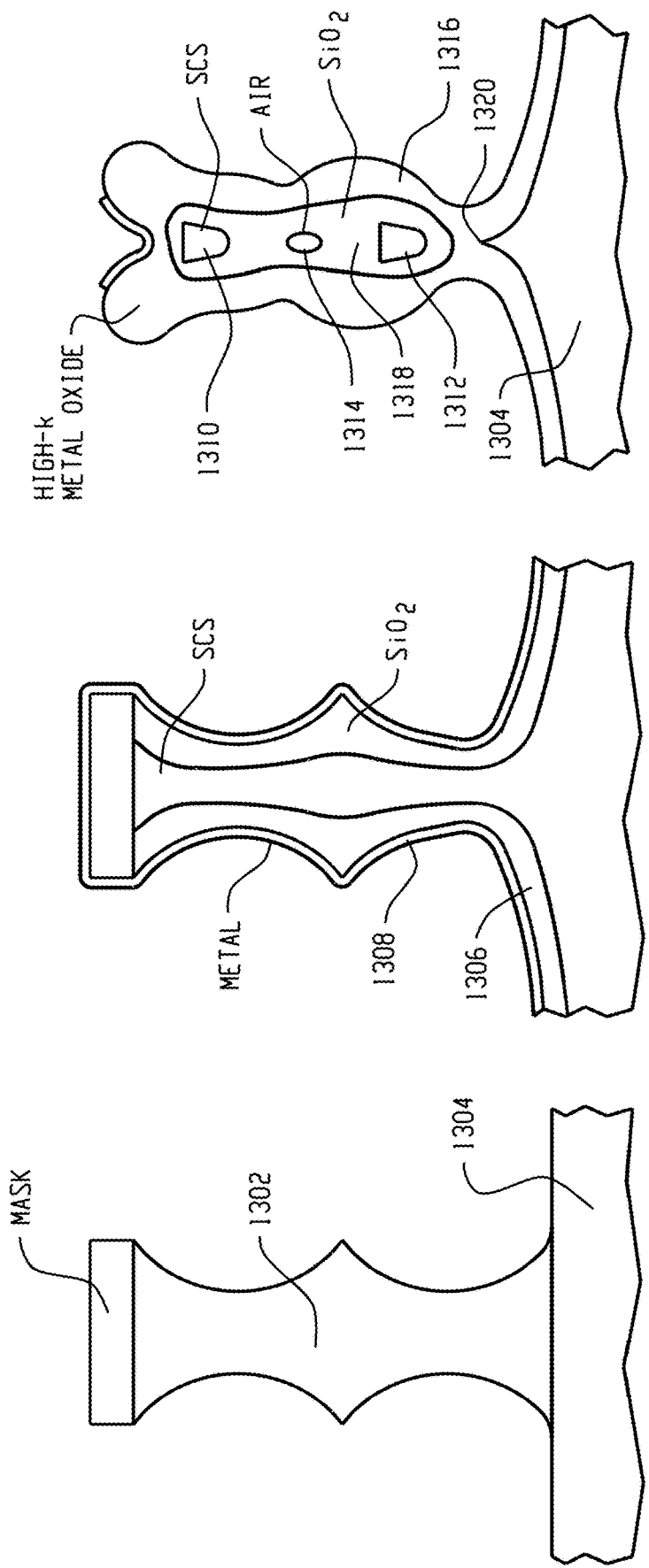

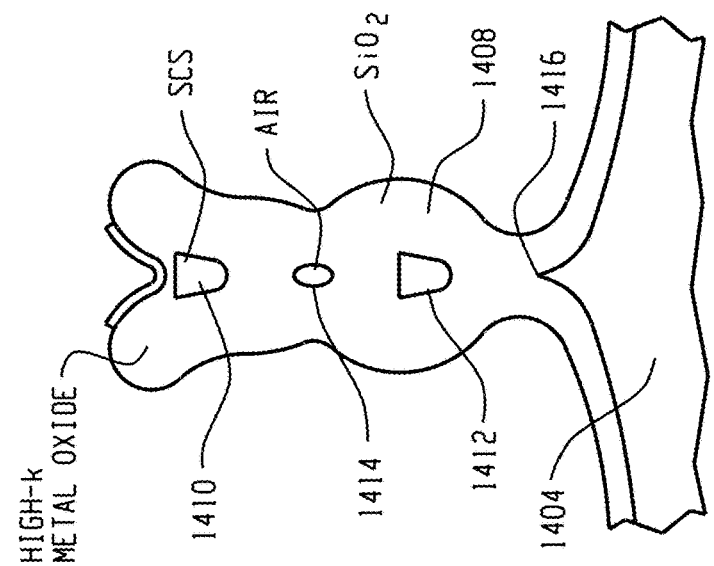
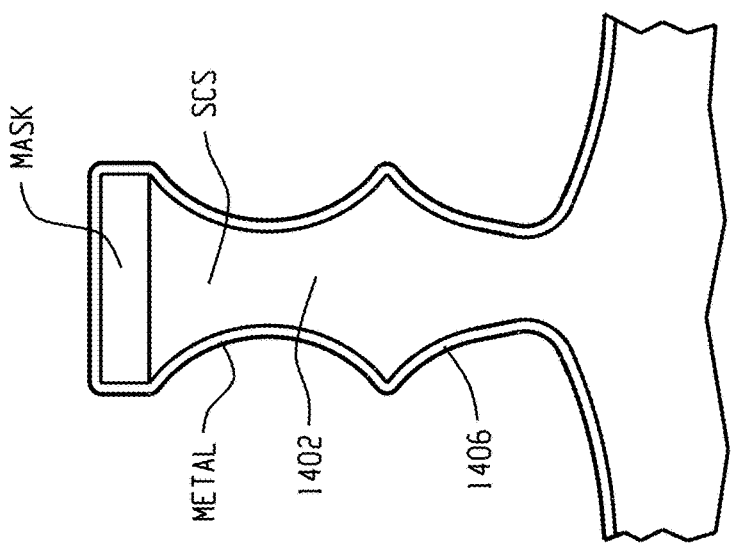
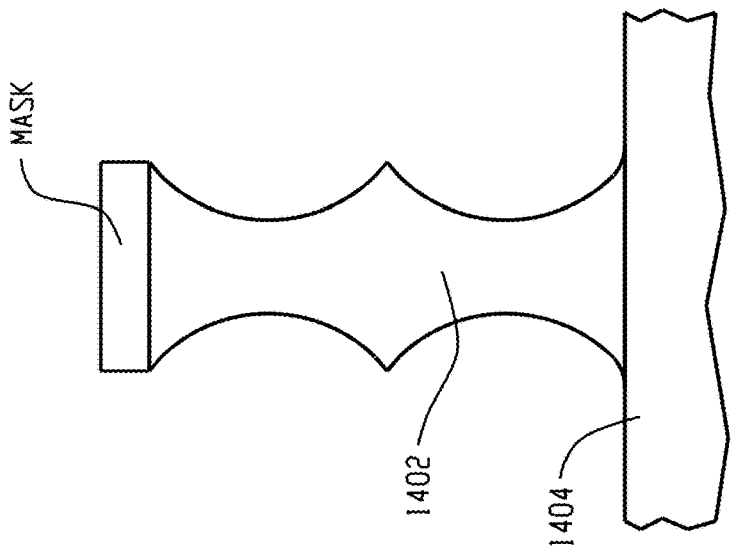

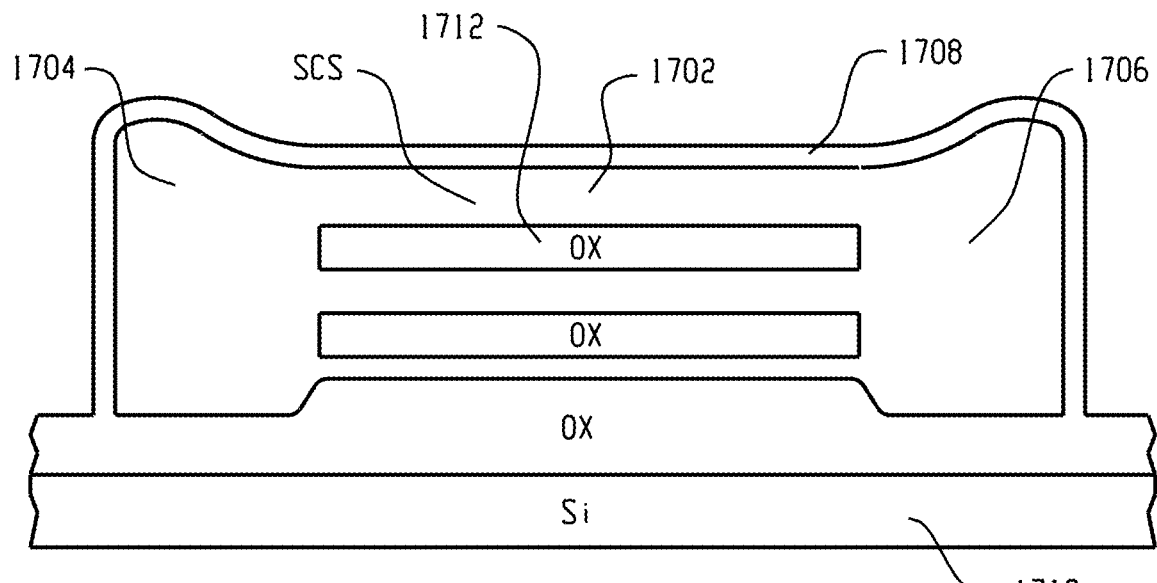
Fig. 17(A)
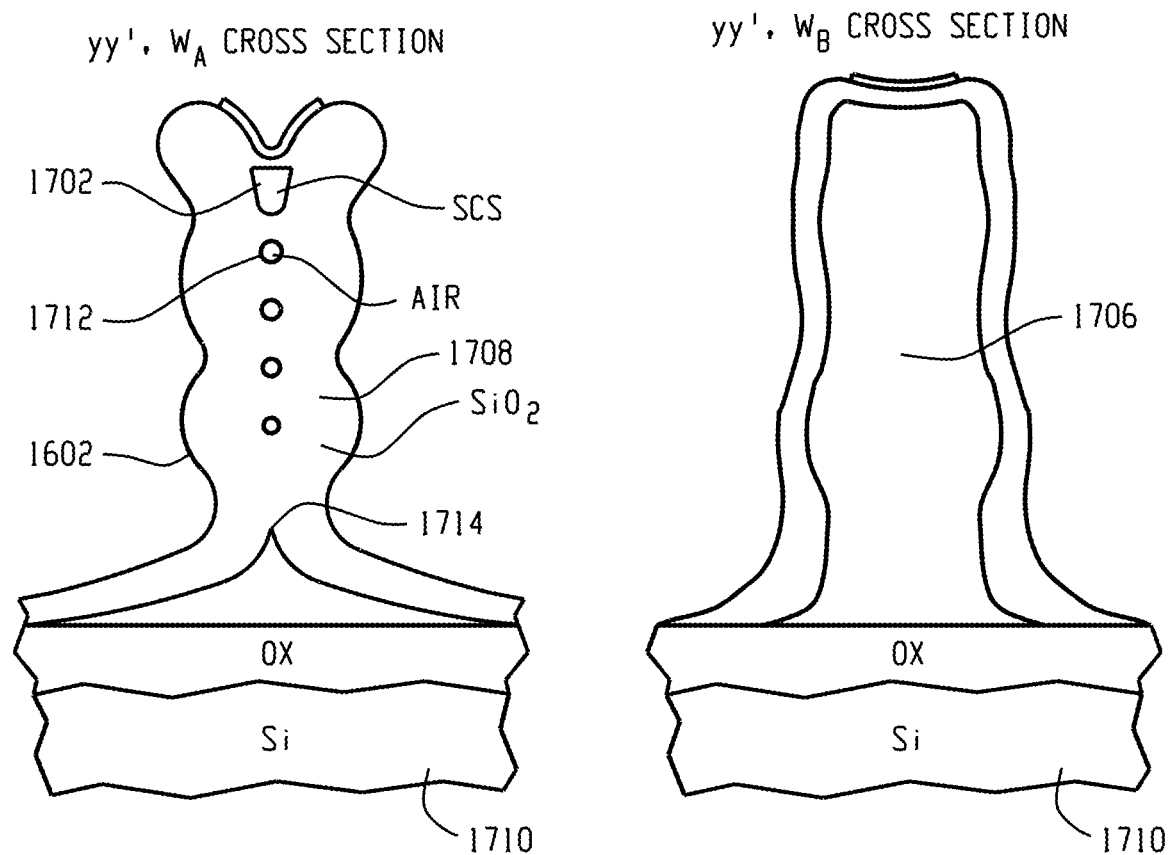
Fig. 17(B)
Fig. 17(C)

SYSTEMS AND METHODS FOR FORMING NANOWIRES USING ANODIC OXIDATION

PRIORITY CLAIM AND CROSS-REFERENCE

This application is a divisional application of U.S. patent application Ser. No. 14/315,421, entitled "Systems and Methods for Forming Nanowires Using Anodic Oxidation," filed Jun. 26, 2014, which claims priority to and benefit from U.S. Provisional Patent Application No. 61/972,462, entitled "Equipment and Method for Fabricating Nanowire by Self Ending Anodization," filed Mar. 31, 2014, both of which are incorporated herein by reference in their entireties.

BACKGROUND

The technology described in this disclosure relates generally to semiconductor devices and more particularly to fabrication of semiconductor devices.

Anodic oxidation includes an accelerated electrochemical oxidation process. For example, a cathode electrode and an anode electrode are immersed in an electrolytic solution and connected electrically to a power supply. Oxides can be grown at the anode electrode at room temperature. Depending on process conditions, the anodic oxide may be relatively porous. An annealing process can be performed at a temperature in a range of about 450° C. to about 500° C. to densify the oxide and remove residual water.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7(A)-FIG. 7(C) depict example diagrams of an anodic oxidation process performed on a protruding structure showing charge distribution, in accordance with some embodiments.

FIG. 12(A) and FIG. 12(B) depict example diagrams showing formation of multiple nanowires through anodic oxidation, in accordance with some embodiments.

FIG. 13(A)-FIG. 13(C) depict other example diagrams showing formation of multiple nanowires through anodic oxidation, in accordance with some embodiments.

FIG. 14(A)-FIG. 14(C) depict other example diagrams showing formation of multiple nanowires through anodic oxidation, in accordance with some embodiments.

FIG. 17(A)-FIG. 17(C) depict example diagrams showing cross-section views along different cutlines respectively, in accordance with some embodiments.

DETAILED DESCRIPTION

Figure 1:
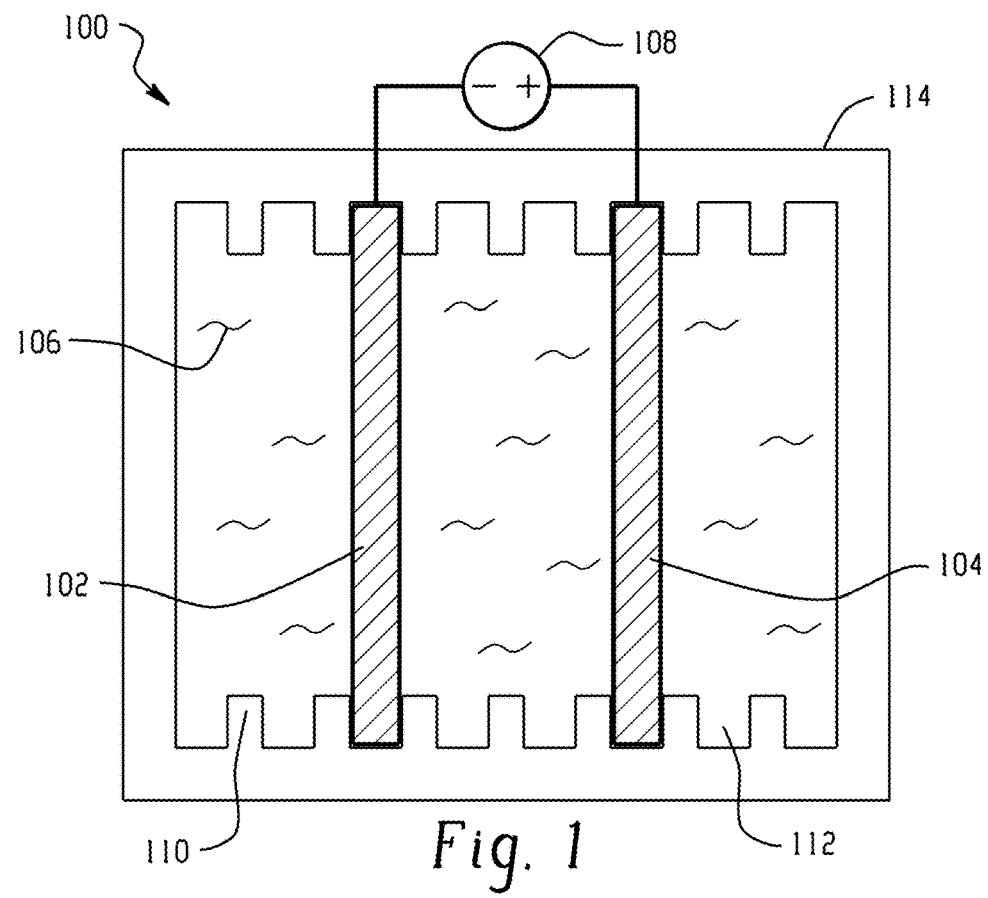
FIG. 1 depicts an example diagram showing a top view of an apparatus for anodic oxidation for forming nanowires, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," "under," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 depicts an example diagram showing a top view of an apparatus for anodic oxidation for forming nanowires, in accordance with some embodiments. As shown in FIG. 1, in the apparatus 100, a cathode electrode 102 including metal materials (e.g., Ag, Pt, etc.) and an anode electrode 104 including a semiconductor wafer (e.g., Si, GaAs, semiconductor-on-insulator, III-V materials, II-VI materials, etc.) are placed (e.g., immersed) in an electrolytic solution 106 for anodic oxidation. The cathode electrode 102 and the anode electrode 104 are connected electrically to a power supply 108. An electrode holder 110 includes multiple slots 112 for holding the cathode electrode 102 and the anode electrode 104. The apparatus 100 further includes a tank 114 to contain the electrolytic solution 106.

Figure 2:
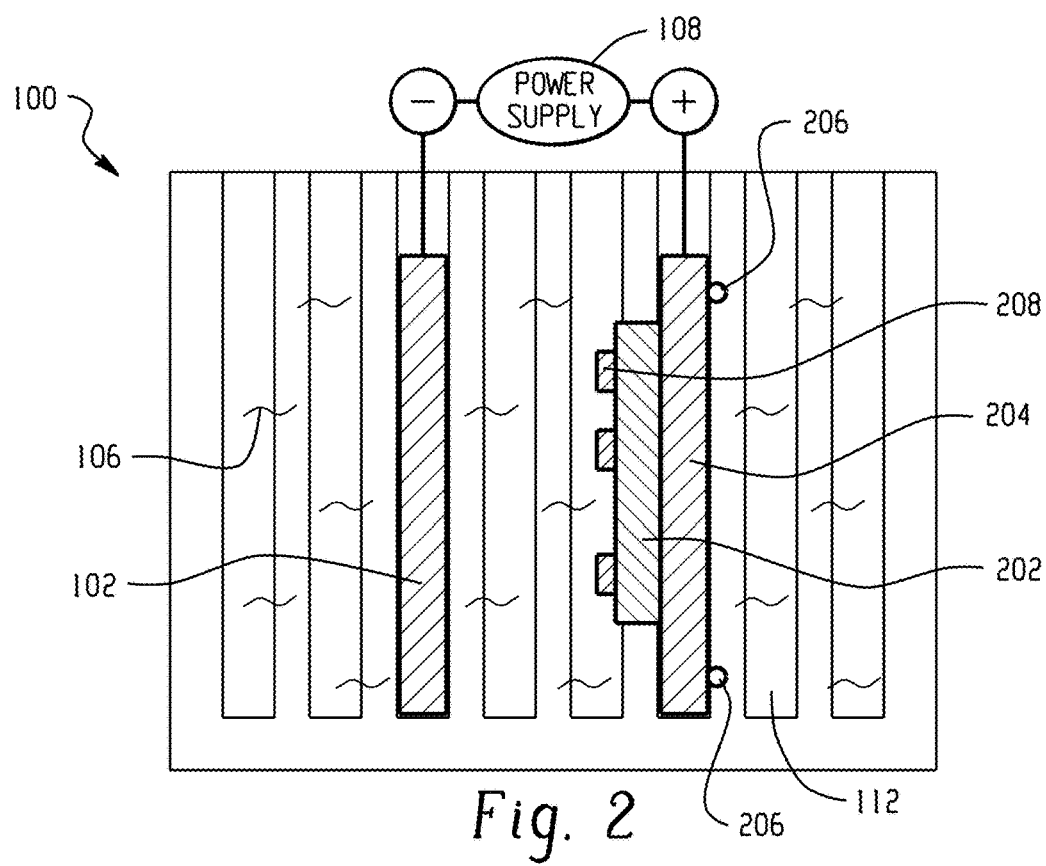
FIG. 2 depicts an example diagram showing a side view of the apparatus as shown in FIG. 1, in accordance with some embodiments.

FIG. 2 depicts an example diagram showing a side view of the apparatus as shown in FIG. 1, in accordance with some embodiments. As shown in FIG. 2, the anode electrode 104 includes a wafer electrode 202 and a conductive material 204 (e.g., Pt, Ag, inert conductive materials, etc.), where the wafer electrode 202 includes a semiconductor wafer (e.g., Si, GaAs, semiconductor-on-insulator, III-V materials, II-VI materials, etc.). One or more protruding structures 208 are formed on the wafer electrode 202 for nanowire formation.

Specifically, the electrolytic solution 106 includes deionized water. For example, one or more chemicals may be included in the electrolytic solution 106 to provide a suitable PH level and/or suitable ionic strength. The power supply 108 includes a direct-current power supply with or without alternating-current components (e.g., 1 MHz). An insulator material 206 includes a rubber, O-ring, or any other insulating material for support of the metal electrode 204.

Figure 3:
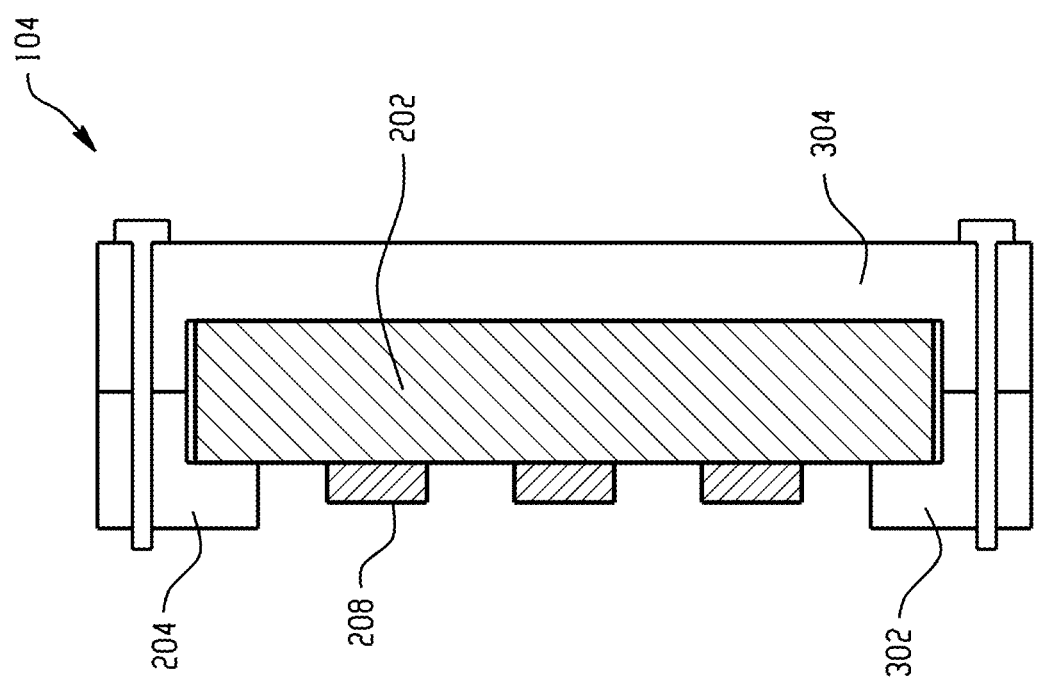
FIG. 3 depicts an example diagram showing an anode electrode as part of the apparatus as shown in FIG. 1, in accordance with some embodiments.

FIG. 3 depicts an example diagram showing an anode electrode as part of the apparatus as shown in FIG. 1, in accordance with some embodiments. As shown in FIG. 3, the conductive material 204 (e.g., Pt, Ag, inert conductive materials, etc.) corresponds to a conductive holder that holds the wafer electrode 202 so that the wafer electrode 202 does not move around freely.

Specifically, the conductive material 204 includes a top part 302 and a bottom part 304 for holding the wafer electrode 202. The top part 302 is in contact with part of a top surface of the wafer electrode 202 and includes holes for clamping the wafer electrode 202. The protruding structures 208 are not in contact with the conductive material 204. The bottom part 304 is in contact with a bottom surface of the wafer electrode 202.

In some embodiments, the wafer electrode 202 is sandwiched between the top part 302 and the bottom part 304 of the conductive material 204 through vacuum. The wafer electrode 202 and the conductive material 204 are electrically connected to the power supply 108 through one or more wires attached to the conductive material 204. The protruding structure 208 has a width and a height, and an aspect ratio of the protruding structure 208 is equal to the height divided by the width. In certain embodiments, the aspect ratio of the protruding structure 208 is larger than an aspect-ratio threshold (e.g., 1).

Figure 4:
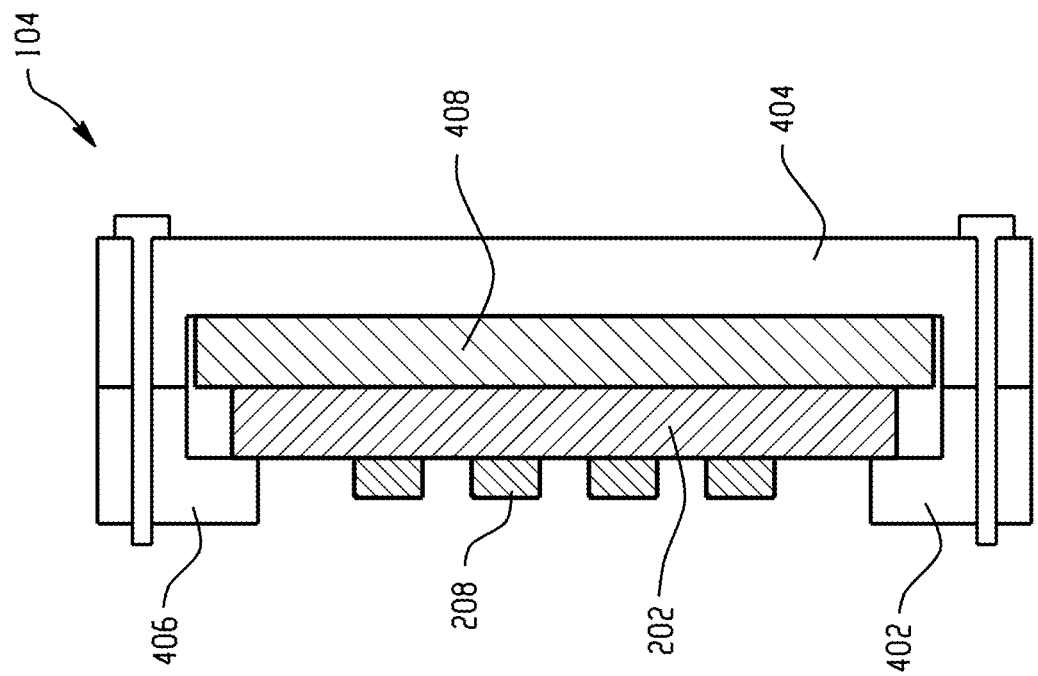
FIG. 4 depicts another example diagram showing an anode electrode as part of the apparatus as shown in FIG. 1, in accordance with some embodiments.

FIG. 4 depicts another example diagram showing an anode electrode as part of the apparatus as shown in FIG. 1, in accordance with some embodiments. As shown in FIG. 4, the conductive material 204 includes a conductive holder 406 and a metal electrode 408. The conductive holder 406 holds both the wafer electrode 202 and the metal electrode 408.

Specifically, the conductive holder 406 includes a top part 402 and a bottom part 404 for holding both the wafer electrode 202 and the metal electrode 408. The top part 402 is in contact with part of a top surface of the wafer electrode 202 and includes holes for clamping the wafer electrode 202 and/or the metal electrode 408. The protruding structures 208 are not in contact with the conductive holder 406. The bottom part 404 is in contact with a bottom surface of the metal electrode 408.

In some embodiments, the metal electrode 408 includes Ag, Pt, inert conductive materials, etc. The wafer electrode 202 and the metal electrode 408 are sandwiched between the top part 402 and the bottom part 404 of the conductive holder 406 through vacuum. The wafer electrode 202, the metal electrode 408, and the conductive holder 406 are electrically connected to the power supply 108 through one or more wires attached to the conductive holder 406.

Figure 5:
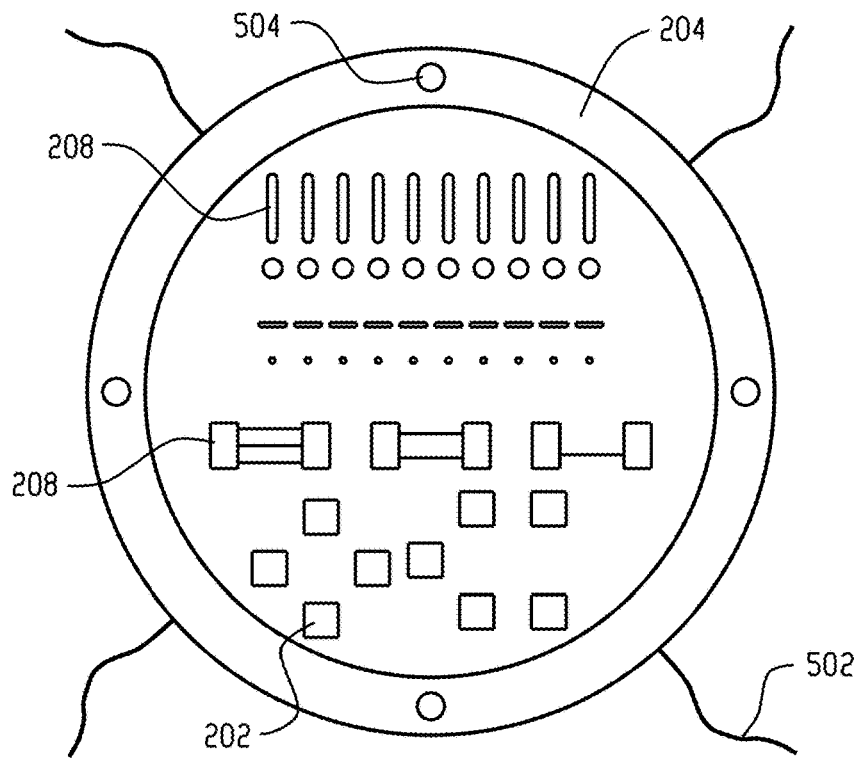
FIG. 5 depicts an example diagram showing protruding structures on a wafer electrode, in accordance with some embodiments.

FIG. 5 depicts an example diagram showing protruding structures on a wafer electrode, in accordance with some embodiments. As shown in FIG. 5, the protruding structures 208 include nanowire-shaped structures, nanoslates, nanorods, nanostructures disposed between pads, or any other suitable nanostructures. The aspect ratios of the protruding structures 208 are greater than a threshold (e.g., 1).

For example, a minimum feature width is in a range of about 10 nm to about 100 nm. The heights of the protruding structures 208 are in a range of about 10 nm to about 500 nm, depending on the number of nanowires needed. The side walls of the protruding structures 208 are of: vertical shapes, trapezoidal shapes, scalloped shapes, shapes of which a top width is larger than or equal to a bottom width, or any other suitable shapes. The conductive material 204 (e.g., a top part) includes holes 504 for clamping the wafer electrode 202. The wafer electrode 202 and the conductive material 204 are electrically connected to the power supply 108 through one or more wires 502 attached to the conductive material 204.

Figure 6:
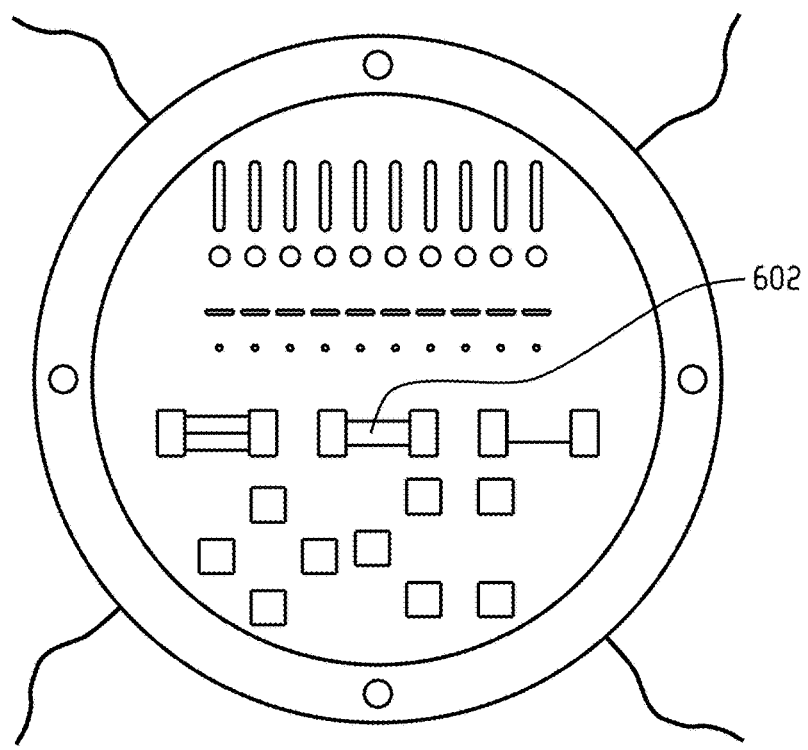
FIG. 6 depicts an example diagram showing patterns for forming protruding structures on a wafer electrode, in accordance with some embodiments.

FIG. 6 depicts an example diagram showing patterns for forming protruding structures on a wafer electrode, in accordance with some embodiments. As shown in FIG. 6, the patterns 602 are used to form protruding structures (e.g., the structures 208) on a substrate. In some embodiments, the patterns 602 are formed using photoresist, oxides, silicon nitrides, or any other suitable materials.

A trench etching is performed using the patterns 602 as etch masks to form the protruding structures (e.g., the structures 208) with high aspect ratios. In certain embodiments, the trench etching includes repeated isotropic etching cycles, an anisotropic etching, or a combined isotropic/passivation cycles. The substrate including the protruding structures is then placed (e.g., immersed) in an electrolytic solution for anodic oxidation.

Figure 8C:
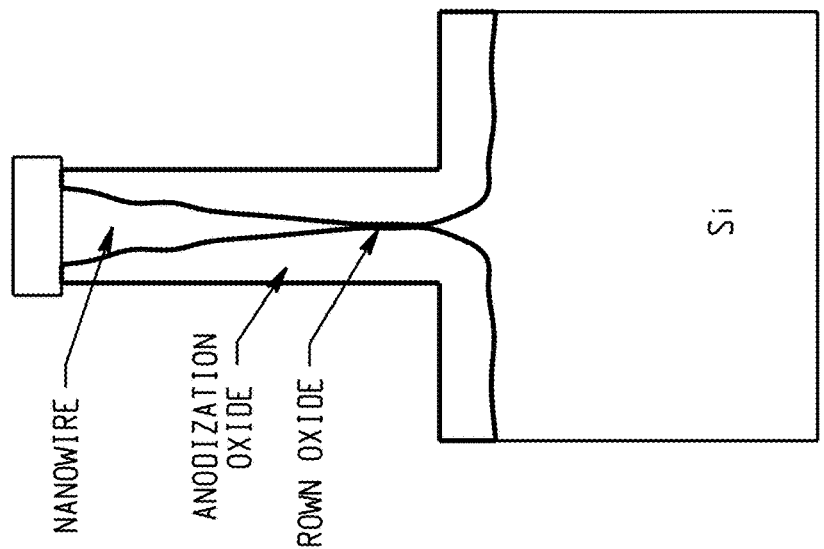
FIG. 8(A)-FIG. 8(C) depict example diagrams of an anodic oxidation process performed on a protruding structure without showing charge distribution, in accordance with some embodiments.
Figure 8B:
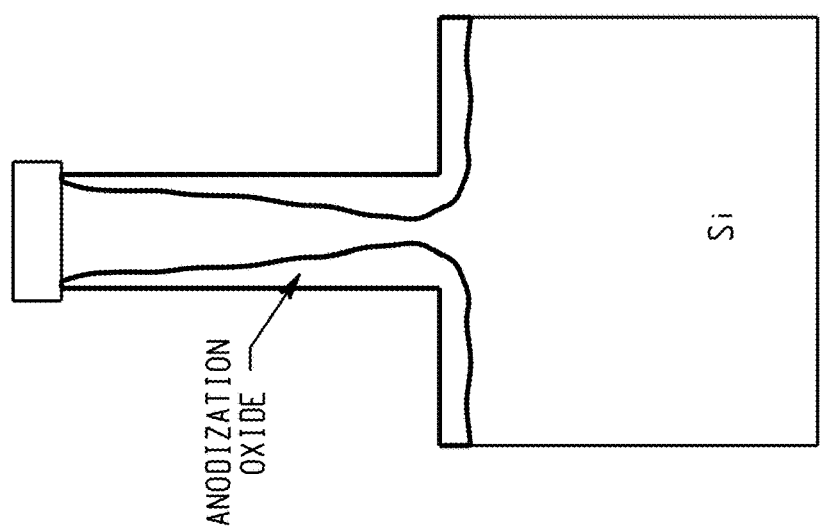
Figure 8A:
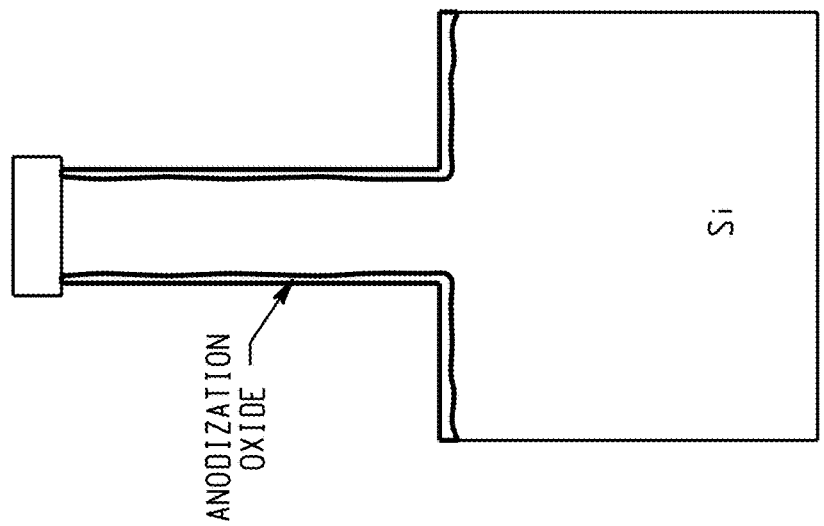
Figure 9A:
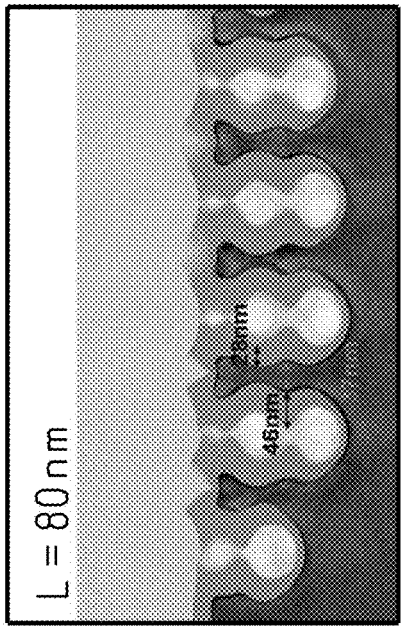
FIG. 9(A)-FIG. 9(D) depict example diagrams showing anodic oxidation performed on different wafer electrodes, in accordance with some embodiments.
Figure 9B:
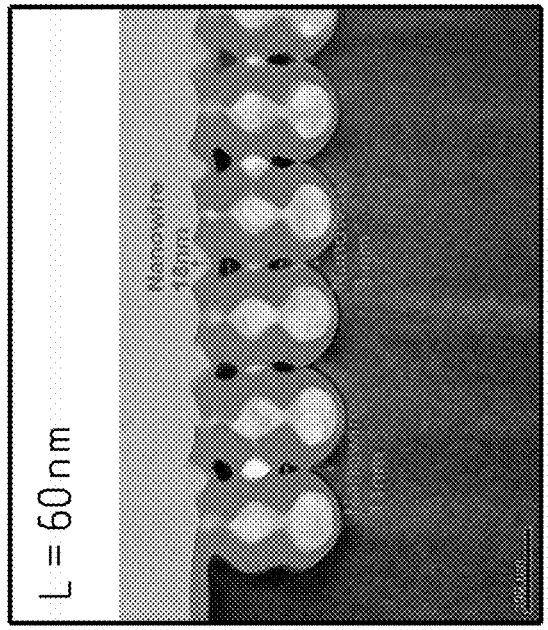
Figure 9C:
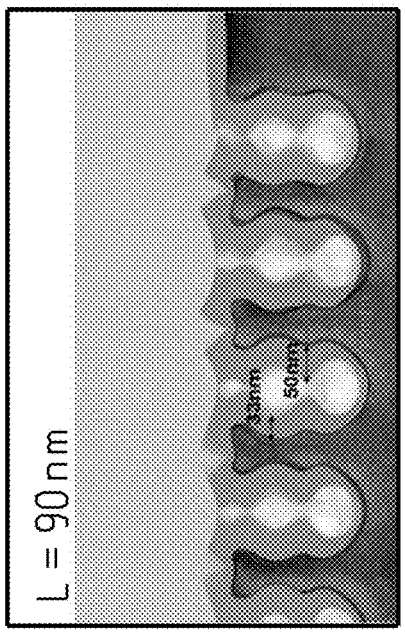
Figure 9D:
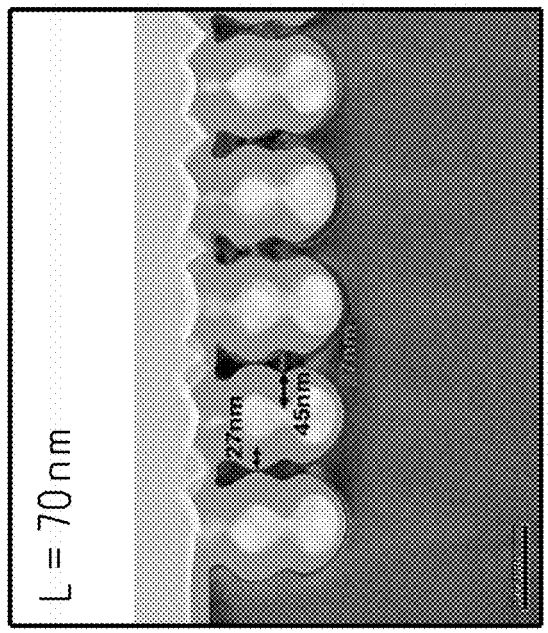

FIG. 7(A)-FIG. 7(C) depict example diagrams of an anodic oxidation process performed on a protruding structure showing charge distribution, and FIG. 8(A)-FIG. 8(C) depict example diagrams of an anodic oxidation process performed on a protruding structure without showing charge distribution, in accordance with some embodiments. A mask layer 702 protects a top part of the protruding structure 704. As shown in FIG. 7(A), at the beginning of the anodic oxidation process, positive charges distributes approximately uniformly across the protruding structure. An oxide layer is formed approximately uniformly from top to bottom of the protruding structure, as shown in FIG. 7(A) and FIG.

8(A). An electric field (e.g., $E_{top1}$) associated with a top part 706 of the protruding structure 704 is approximately equal to an electric field (e.g., $E_{bot1}$) associated with a bottom part 708 of the protruding structure 704 in magnitude. The protruding structure 704 is associated with a resistance $R_1$.

As shown in FIG. 7(B), further into the anodic oxidation process, the charge distribution changes as the oxide grows. The oxide grows more at the bottom part 708 than at the top part 706, as shown in FIG. 7(B) and FIG. 8(B). An electric field (e.g., $E_{top2}$) associated with the top part 706 becomes smaller than the electric field $E_{top1}$ in magnitude, while an electric field (e.g., $E_{bot2}$) associated with the bottom part 708 is approximately equal to the electric field $E_{bot1}$ in magnitude. A resistance $R_2$ associated with the protruding structure 704 at this stage is larger than the resistance $R_1$.

At the end of the anodic oxidation process, the oxide further grows at the bottom part of the protruding structure 704 until a conduction channel of charges to the top part of the protruding structure 704 is closed off, as shown in FIG. 7(C) and FIG. 8(C). An electric field (e.g., $E_{top3}$) associated with the top part decreases to a small magnitude (e.g., zero), and an electric field (e.g., $E_{bot3}$) associated with the bottom part also becomes approximately zero. Once the conduction channel of charges to the top part is sealed off, the oxide stops growing at the top part. The un-oxidized semiconductor material (e.g., Si, GaAs, semiconductor-on-insulator, III-V materials, II-VI materials, etc.) at the top part of the protruding structure 704 forms a nanowire.

FIG. 9(A)-FIG. 9(D) depict example diagrams showing anodic oxidation performed on different wafer electrodes, in accordance with some embodiments. Different wafer electrodes include protruding structures of different widths respectively. As shown in FIG. 9(A)-9(D), under approximately same conditions for anodic oxidation (e.g., duration of oxidation), nanowires are formed for the protruding structures with a width of 60 nm, where oxides surround the formed nanowires. For the protruding structures with widths of 70 nm, 80 nm, and 90 nm, oxides did not grow farther enough to enclose parts of the semiconductor material to form nanowires. It indicates that under certain conditions for anodic oxidation (e.g., duration of oxidation), nanowires can be formed for a protruding structure with a width no larger than a width threshold.

Figure 10B:
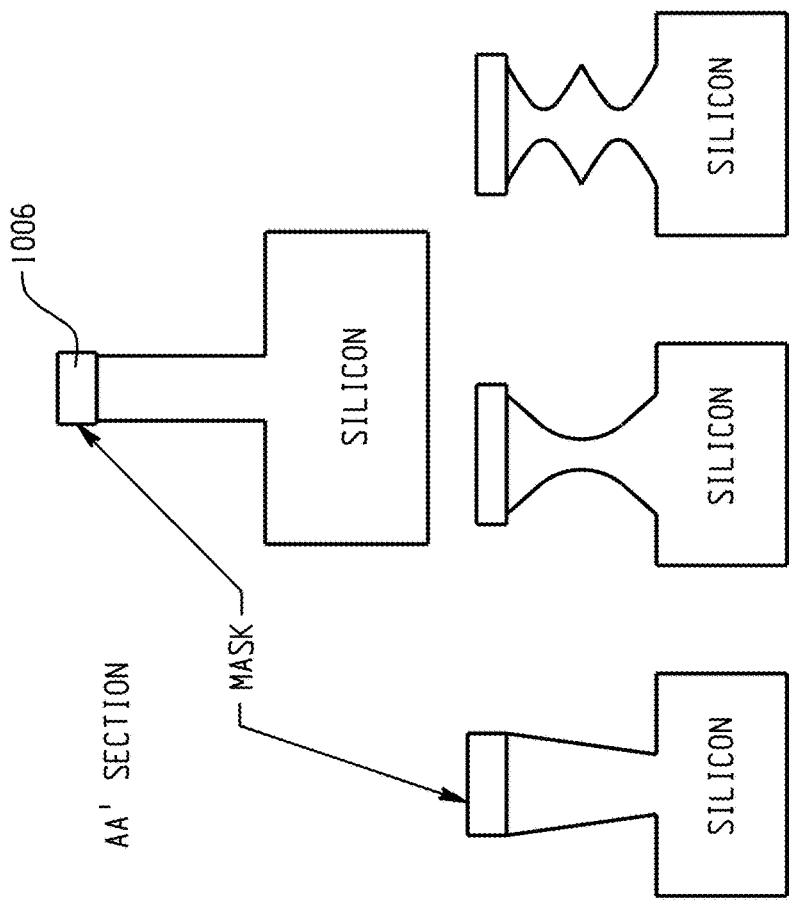
FIG. 10(B) depicts an example diagram showing a cross-section view of the pattern along a cutline, in accordance with some embodiments.
Figure 10A:
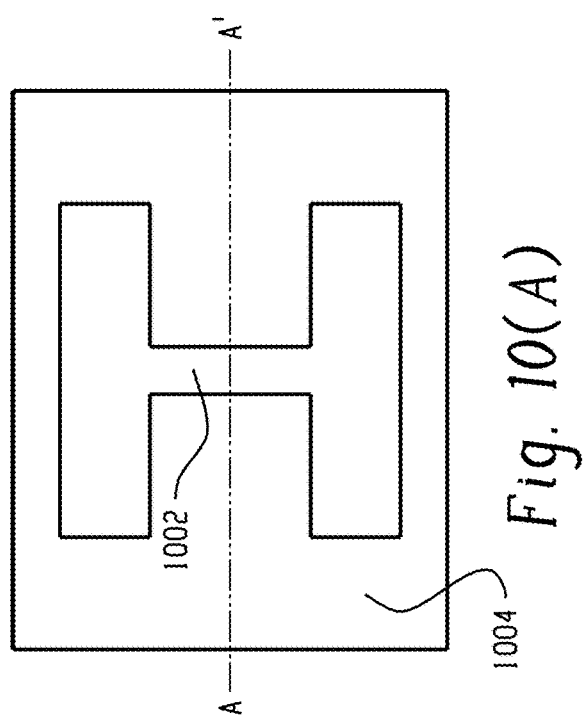
FIG. 10(A) depicts an example diagram showing a pattern of a protruding structure on a wafer electrode.

FIG. 10(A) depicts an example diagram showing a pattern of a protruding structure on a wafer electrode, and FIG. 10(B) depicts an example diagram showing a cross-section view of the pattern along a cutline AA', in accordance with some embodiments. As shown in FIG. 10(A), the protruding structure 1002 is patterned on a wafer electrode 1004 that includes a substrate (e.g., Si, GaAs, semiconductor-on-insulator, III-V materials, II-VI materials, etc.). For example, the patterning of the protruding structure 1002 is performed through e-beam lithography and etching. In another example, the patterning of the protruding structure 1002 is performed through extreme ultraviolet lithography, resist trimming, and etching. In yet another example, the patterning of the protruding structure 1002 is performed through a nano-patterning process, e.g., charged-ion-beam (CIB). As shown in FIG. 10(B), different profiles of the protruding structure 1002 can be formed. The aspect ratio of the protruding structure 1002 exceeds an aspect ratio threshold (e.g., 1). In some embodiments, a mask 1006 is formed through lithography, or formed during a subsequent anodic oxidation process.

Figure 11:
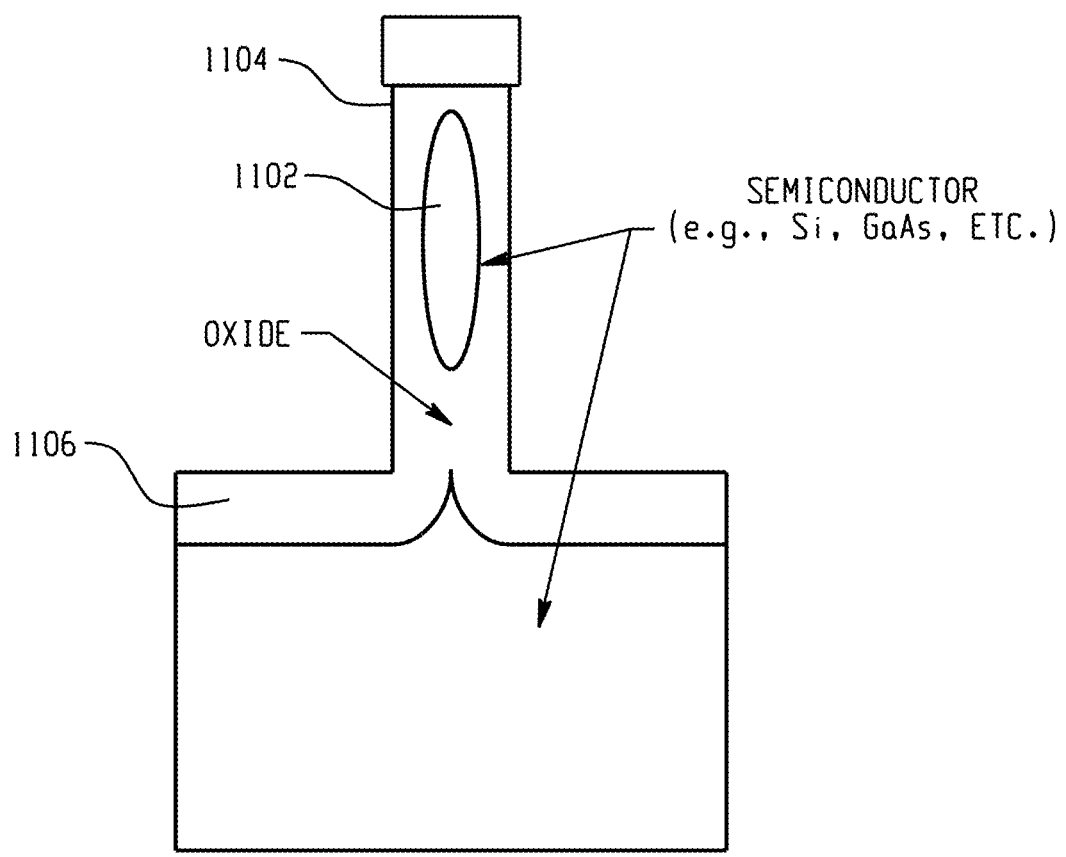
FIG. 11 depicts an example diagram showing a cross-section view of a wafer electrode including a protruding structure after anodic oxidation, in accordance with some embodiments.

FIG. 11 depicts an example diagram showing a cross-section view of a wafer electrode including a protruding structure after anodic oxidation, in accordance with some embodiments. As shown in FIG. 11, a nanowire 1102 is formed in the protruding structure 1104 and is surrounded by the anodic oxide 1106 formed during the anodic oxidation.

Specifically, non-uniform electric field (e.g., due to electric field self-distribution as shown in FIG. 7(A)-FIG. 7(C)) in the protruding structure 1104 during the anodic oxidation causes non-uniform formation of the oxide 1106. For example, a width of a top part of the protruding structure 1104 is larger than or equal to a width of a bottom part of the protruding structure 1104. The anodic oxidation of the top part of the protruding structure 1104 ends when the oxidation of the bottom part of the protruding structure 1104 closes off a conduction channel of charges to the top part. In some embodiments, the protruding structure 1104 may undergo alternation of anodic oxidation and etching, so that nanowires with small sizes (e.g., 5-7 nm) covered with a dielectric material (e.g., oxides) can be formed.

FIG. 12(A) and FIG. 12(B) depict example diagrams showing formation of multiple nanowires through anodic oxidation, in accordance with some embodiments. As shown in FIG. 12(A), a protruding structure 1202 formed on a substrate 1204 undergoes multiple (e.g., two) etching and passivation cycles to form multiple (e.g., two) undercut features (e.g., scalloped shapes). Anodic oxidation is performed on the substrate 1204 with the protruding structure 1202.

Multiple nanowires can be formed in the protruding structure 1202, and a dielectric material 1212 (e.g., oxides) surrounds the nanowires. In some embodiments, diameters of the nanowires become smaller from top to bottom of the protruding structure 1202. In certain embodiments, the diameters of the nanowires are approximately equal with properly designed processes (e.g., etching cycles).

As shown in FIG. 12(B), the nanowire 1206 is formed first in a top part of the protruding structure 1202, and the nanowire 1208 is then formed in a bottom part of the protruding structure 1202. One or more nano-vias 1210 are also formed during the anodic oxidation. In some embodiments, the nanowire 1206 has a diameter smaller than 9 nm. In certain embodiments, the nanowire 1208 has a smaller diameter than the nanowire 1206. In some embodiments, the diameters of the nanowires 1208 and 1206 are approximately equal.

FIG. 13(A)-FIG. 13(C) depict other example diagrams showing formation of multiple nanowires through anodic oxidation, in accordance with some embodiments. As shown in FIG. 13(A), a protruding structure 1302 formed on a substrate 1304 undergoes multiple (e.g., two) etching and passivation cycles to form multiple (e.g., two) undercut features (e.g., scalloped shapes). A first anodic oxidation process is performed on the substrate 1304 with the protruding structure 1302.

As shown in FIG. 13(B), the protruding structure 1302 is partially oxidized to form an original oxide 1306 (e.g., $SiO_2$) through the first anodic oxidation process. One or more metal materials 1308 (e.g., Hf, Al, etc.) are formed on the original oxide 1306, e.g., through atomic layer deposition (ALD), chemical vapor deposition (CVD), plasma-enhanced atomic layer deposition (PEALD), etc. A second anodic oxidation process is performed on the substrate 1304 with the protruding structure 1302. The metal materials 1308 are converted to a high-k dielectric material (e.g., metal oxides) that is formed on the original oxide 1306.

As shown in FIG. 13(C), at the end of the second anodic oxidation process, nanowires 1310 and 1312 and/or nano-channels 1314 are formed and surrounded by the oxide 1318 (e.g., $SiO_2$) and the high-k dielectric material 1316. For example, the effective dielectric constant of the mixture of the high-k dielectric material 1316 and the oxide 1318 is larger than that of the oxide 1318. In some embodiments, the diameters of the nanowires 1310 and 1312 are approximately equal and smaller than 9 nm. In certain embodiments, the diameter of the nanowires 1310 is larger than the diameter of the nanowire 1312. The substrate 1304 includes a ridge section 1320 extending under the protruding structure 1302. For example, the ridge section 1320 extends along a same direction as the nanowires 1310 and 1312.

FIG. 14(A)-FIG. 14(C) depict other example diagrams showing formation of multiple nanowires through anodic oxidation, in accordance with some embodiments. As shown in FIG. 14(A), a protruding structure 1402 formed on a substrate 1404 undergoes multiple (e.g., two) etching and passivation cycles to form multiple (e.g., two) undercut features (e.g., scalloped shapes).

As shown in FIG. 14(B), one or more metal materials 1406 (e.g., Hf, Al, etc.) are formed on the protruding structure 1402, e.g., through ALD, CVD, PEALD, etc. An anodic oxidation process is performed on the substrate 1404 with the protruding structure 1402 and the metal materials 1406. The metal materials 1406 are converted to a high-k dielectric material (e.g., metal oxides).

As shown in FIG. 14(C), at the end of the anodic oxidation process, nanowires 1410 and 1412 and/or nano-vias 1414 are formed and surrounded by a mixture 1408 of the high-k dielectric material and the anodic oxide (e.g., $SiO_2$). For example, the effective dielectric constant of the mixture of the high-k dielectric material and the anodic oxide is larger than that of the anodic oxide. In some embodiments, the diameters of the nanowires 1410 and 1412 are approximately equal and smaller than 9 nm. In certain embodiments, the diameter of the nanowires 1410 is larger than the diameter of the nanowire 1412. The substrate 1404 includes a ridge section 1416 extending under the protruding structure 1402. For example, the ridge section 1416 extends along a same direction as the nanowires 1410 and 1412.

Figure 15:
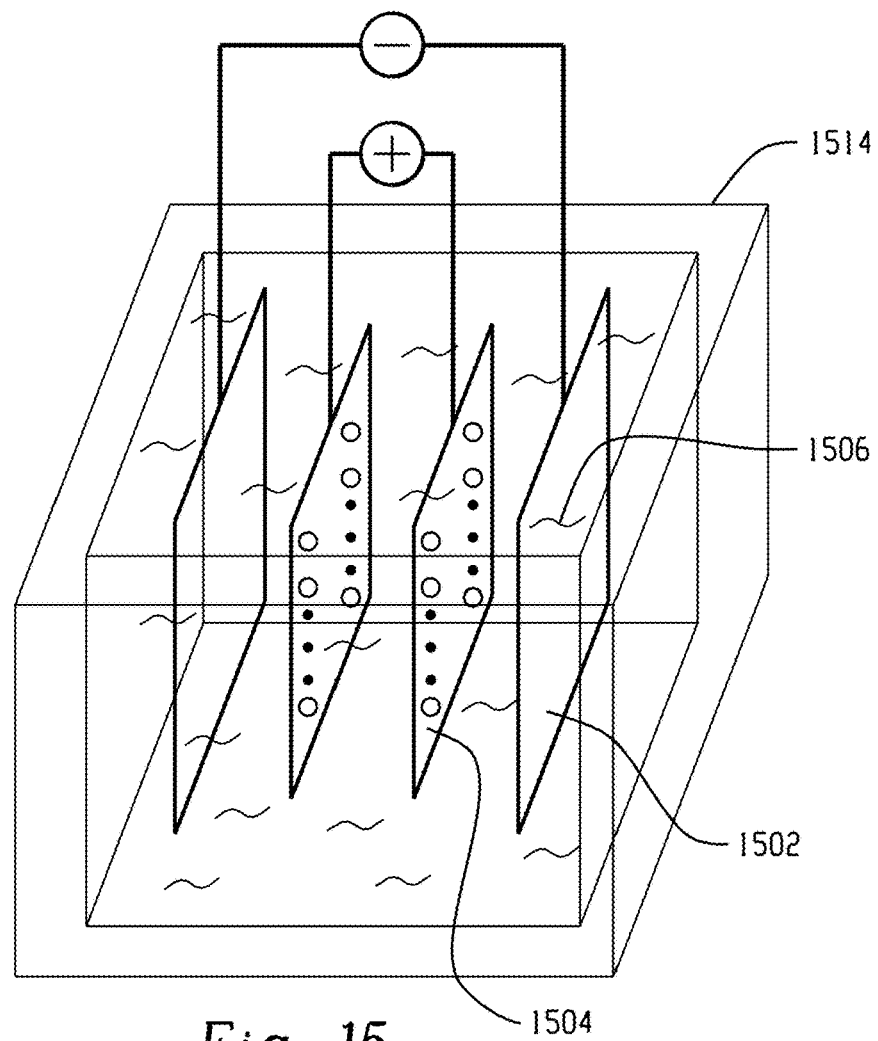
FIG. 15 depicts an example diagram showing anodic oxidation for multiple wafer electrodes, in accordance with some embodiments.

FIG. 15 depicts an example diagram showing anodic oxidation for multiple wafer electrodes, in accordance with some embodiments. As shown in FIG. 15, multiple cathode electrodes 1502 including metal materials (e.g., Ag, Pt, etc.) and multiple anode electrode 1504 including a semiconductor wafer (e.g., Si, GaAs, semiconductor-on-insulator, III-V materials, II-VI materials, etc.) are immersed in an electrolytic solution 1506 which is contained in a tank 1514 for anodic oxidation. The cathode electrodes 1502 and the anode electrodes 1504 are connected electrically to one or more power supplies (not shown).

Figure 16:
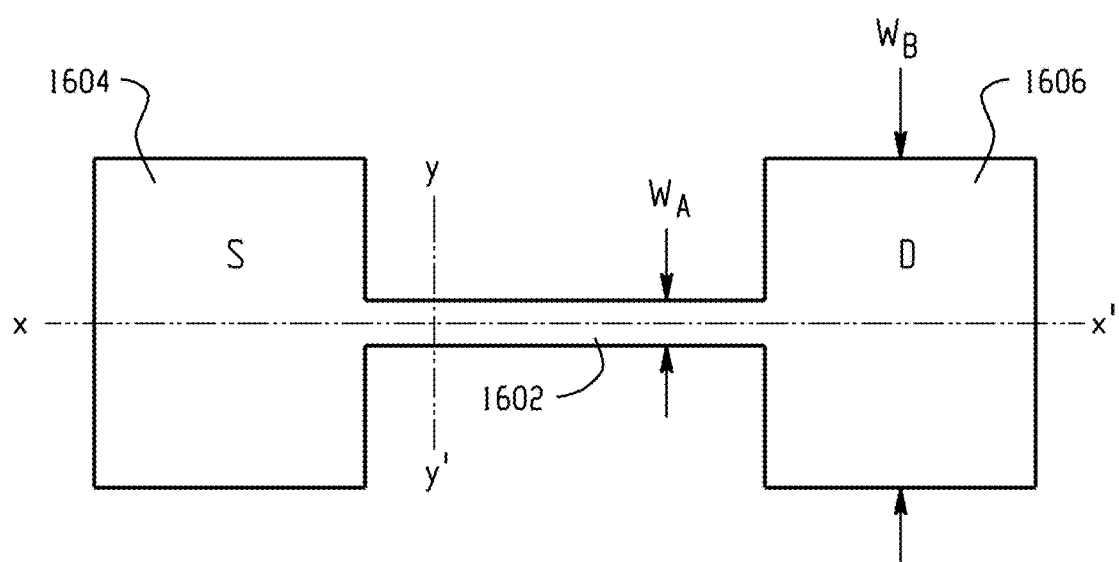
FIG. 16 depicts an example diagram showing a top view of an original mask for forming a protruding structure for a transistor structure, in accordance with some embodiments.

The nanowires formed through anodic oxidation as described above can be used for fabricating nanowire devices. FIG. 16 depicts an example diagram showing a top view of an original mask for forming a protruding structure for a transistor structure, in accordance with some embodiments. As shown in FIG. 16, the protruding structure 1602 can be disposed between a source region 1604 and a drain region 1606. For example, the patterning of the protruding structure 1602 is performed through e-beam lithography and etching. In another example, the patterning of the protruding structure 1602 is performed through extreme ultraviolet lithograph, resist trimming, and etching. In yet another example, the patterning of the protruding structure 1602 is performed through a nano-patterning process, e.g., charged-ion-beam (CM).

Anodic oxidation is performed to form one or more nanowires in the protruding structure 1602. Cross-section views along a cutline xx', a cutline yy' at $W_A$, and the cutline yy' at $W_B$ are shown in FIG. 17(A), FIG. 17(B) and FIG. 17(C), respectively. As shown in FIG. 17(A) and FIG. 17(B), the nanowires 1702 are formed between a source structure 1704 and a drain structure 1706 and surrounded by a dielectric material 1708 (e.g., oxides) that is formed during the anodic oxidation. Nano-vias 1712 (e.g., filled with air or solids) are formed as well. The substrate 1710 includes a semiconductor-on-insulator wafer, silicon, III-V materials, II-VI materials, etc. A cross-section view of the drain structure 1706 is shown in FIG. 17(C). The drain structure 1706 is continuous to the substrate 1710, or isolated from the substrate 1710 (e.g., through suitable design of anodic oxidation). A ridge section 1714 extends under the protruding structure 1602 and along a same direction as the nanowires 1702.

Figure 18A:
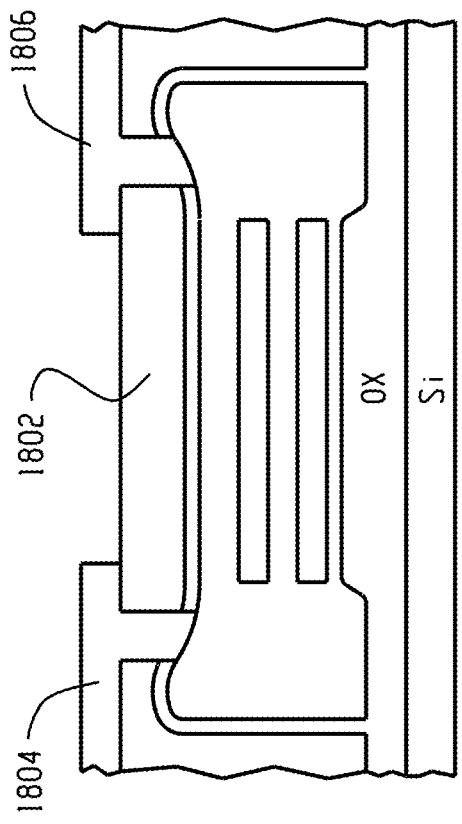
FIG. 18(A)-FIG. 18(D) depict example diagrams showing a process for fabricating a transistor structure using nanowires formed through anodic oxidation, in accordance with some embodiments.
Figure 18B:
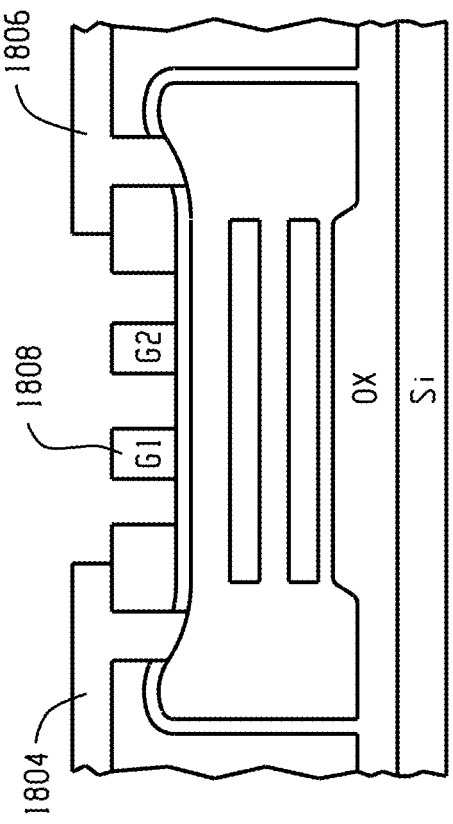
Figure 18C:
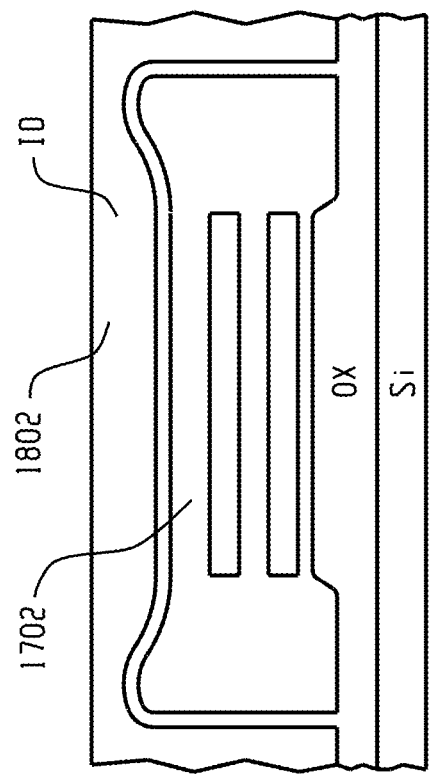
Figure 18D:
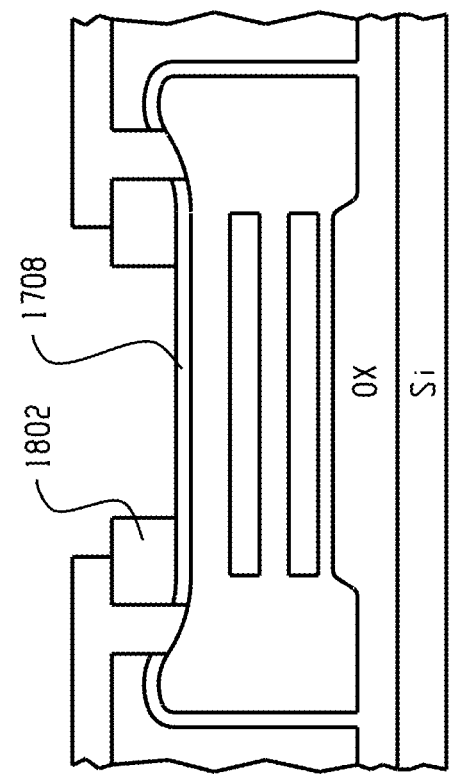

FIG. 18(A)-FIG. 18(D) depict example diagrams showing a process for fabricating a transistor structure using nanowires formed through anodic oxidation, in accordance with some embodiments. As shown in FIG. 18(A), an interlayer dielectric (ILD) layer 1802 is formed on the wafer. Lithography and etching are performed to open source/drain contact areas, and interconnect metallization is carried out to form source/drain contacts 1804 and 1806, as shown in FIG. 18(B). Lithography is performed to pattern gate contact areas, and a selective etching is performed to remove part of the ILD layer 1802, but not the dielectric material 1708, as shown in FIG. 18(C). CIB (e.g., He/Ne beam) is performed to form multiple metal nanogate lines 1808 to form a transistor structure, as shown in FIG. 18(D).

Figure 19A:
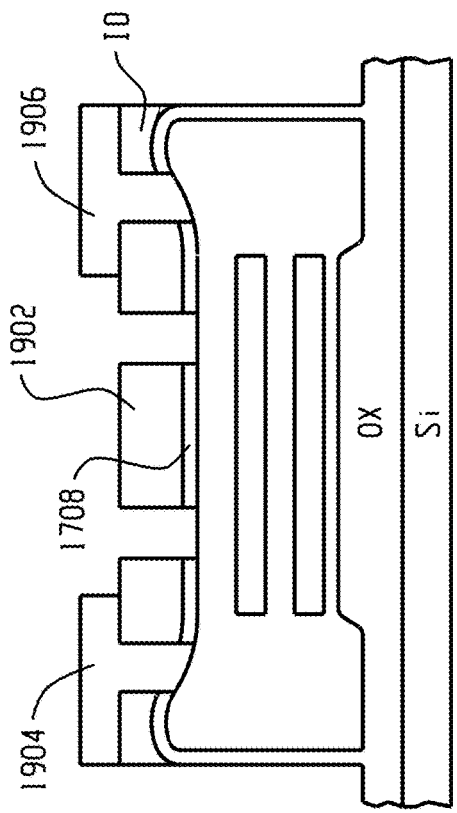
FIG. 19(A)-FIG. 19(D) depict other example diagrams showing a process for fabricating a transistor structure using nanowires formed through anodic oxidation, in accordance with some embodiments.
Figure 19B:
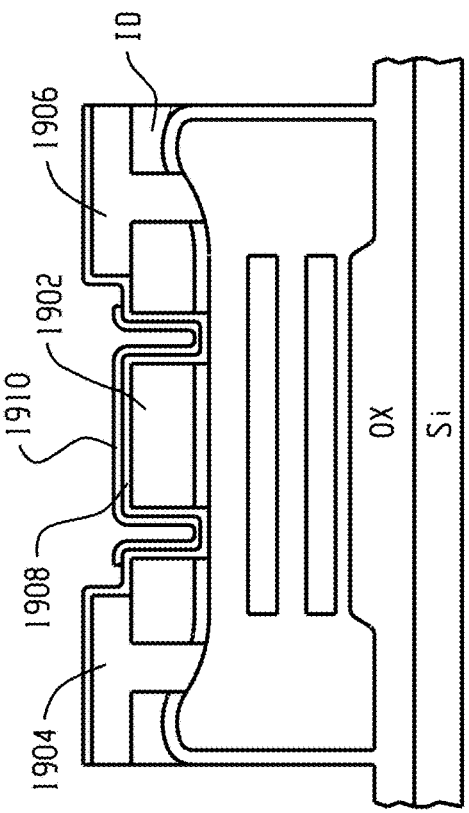
Figure 19C:
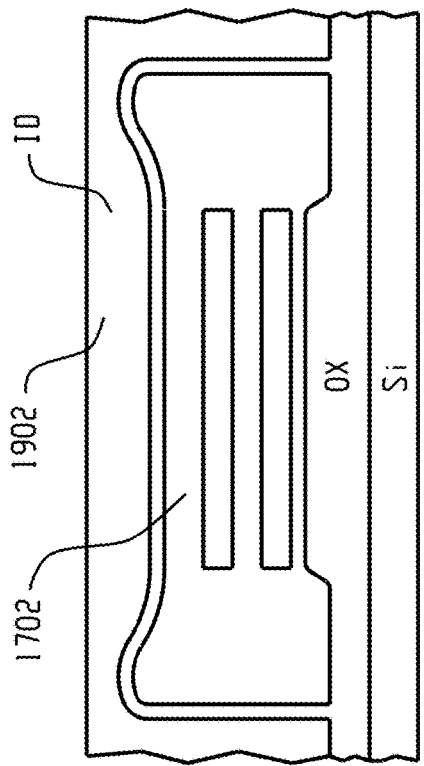
Figure 19D:
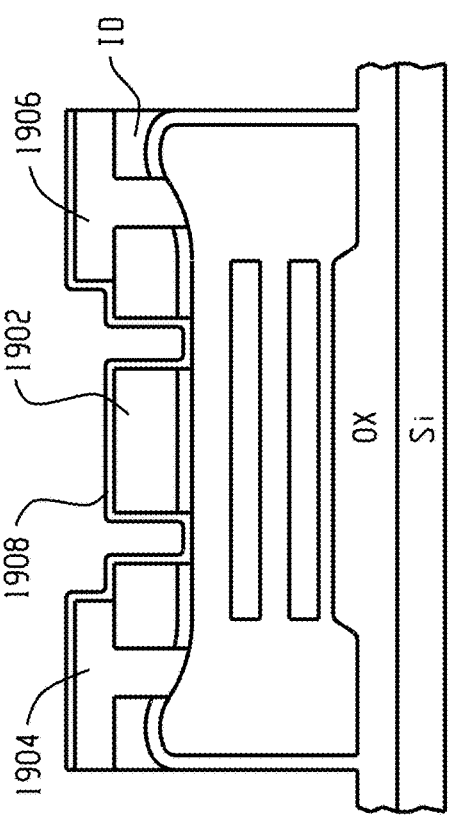

FIG. 19(A)-FIG. 19(D) depict other example diagrams showing a process for fabricating a transistor structure using nanowires formed through anodic oxidation, in accordance with some embodiments. As shown in FIG. 19(A), an interlayer dielectric (ILD) layer 1902 is formed on the wafer. Lithography is performed to pattern source/drain contact areas and gate contact areas, and etching is performed to the ILD layer 1902 and the oxide 1708 in the source/drain contact areas and the gate contact areas. Interconnect metallization is carried out to form source/drain contacts 1904 and 1906, as shown in FIG. 19(B). A dielectric material 1908 (e.g., a high-k material) is formed (e.g., through CVD, ALD, PEALD, etc.) on the wafer, as shown in FIG. 19(C). The formation of the dielectric material 1908 also shrinks a gap size for nanogate formation (e.g., a trench refill process). In some embodiments, a conductive material 1910 (e.g., metal-containing materials) is formed (e.g., through CVD, ALD, PEALD, etc.) on the wafer to form nanogates, as shown in FIG. 19(D). In certain embodiments, CIB (e.g., He/Ne beam) is performed to form multiple metal nanogate lines. Finally, the dielectric material 1908 on top of the source/drain regions are removed.

Figure 20:
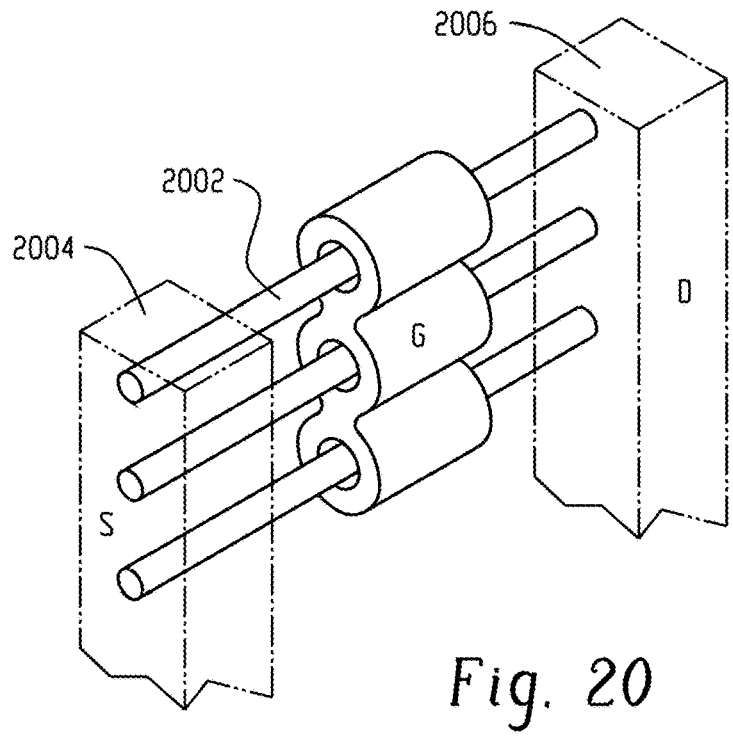
FIG. 20 depicts an example diagram showing a nanowire device, in accordance with some embodiments.

FIG. 20 depicts an example diagram showing a nanowire device, in accordance with some embodiments. As shown in FIG. 20, a stack of nanowires 2002 are fabricated using anodic oxidation as described above. In some embodiments, anodic oxides surrounding the nanowires 2002 are partially removed to physically isolate the nanowires 2002. In certain embodiments, the anodic oxides that surround the nanowires 2002 are completely removed to expose the nanowires 2002. Dielectric materials (e.g., high-k materials) are formed on the nanowires 2002, and CIB is performed to form a single metal nanogate line or multiple metal nanogate lines. Source/drain contacts 2004 and 2006 are formed through lithography, etching and contact formation. A gate-all-around transistor using multiple nanowires is formed.

Figure 21:
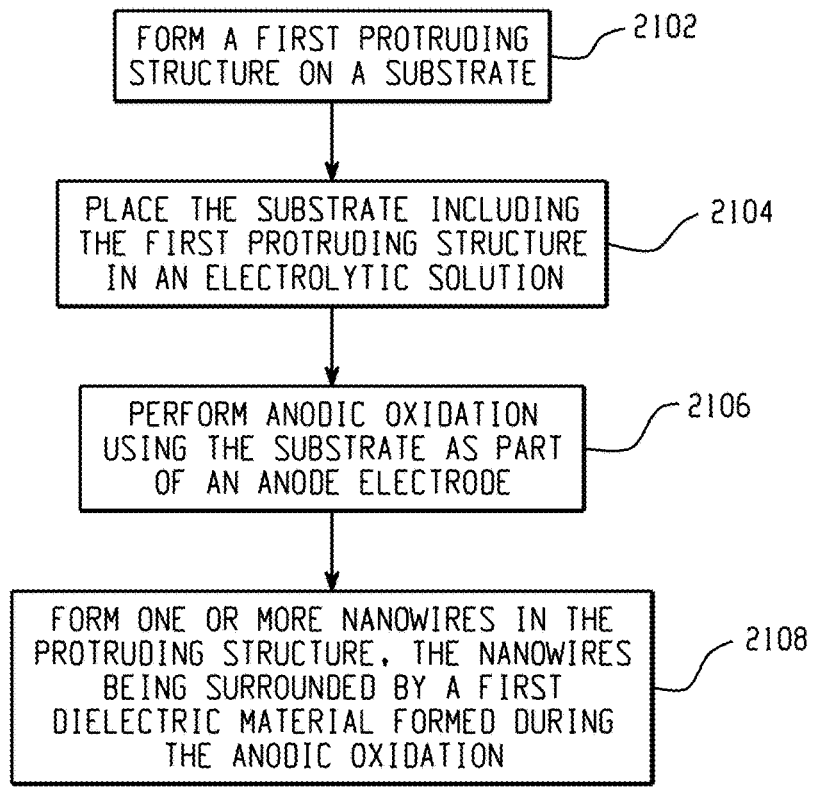
FIG. 21 depicts an example flow chart for forming nanowires, in accordance with some embodiments.

FIG. 21 depicts an example flow chart for forming nanowires, in accordance with some embodiments. At 2102, a first protruding structure is formed on a substrate. At 2104, the first protruding structure is placed in an electrolytic solution. At 2106, anodic oxidation is performed using the substrate as part of an anode electrode. At 2108, one or more nanowires are formed in the protruding structure. The nanowires are surrounded by a first dielectric material formed during the anodic oxidation.

The present disclosure describes formation of nanowires for device fabrication using anodic oxidation. In some embodiments, the devices, structures and methods described herein are configured to fabricate vertically self-aligned nanowires.

According to one embodiment, a method is provided for forming nanowires on a substrate. A first protruding structure is formed on a substrate. The first protruding structure is placed in an electrolytic solution. Anodic oxidation is performed using the substrate as part of an anode electrode. One or more nanowires are formed in the protruding structure. The nanowires are surrounded by a first dielectric material formed during the anodic oxidation.

According to another embodiment, a structure includes: a substrate, a protruding structure formed on the substrate, and one or more nanowires formed in the protruding structure. The substrate includes a ridge section extending under the protruding structure.

According to yet another embodiment, a device includes: a source region, a drain region, and a gate structure. The source region is formed on a substrate, and the drain region is formed on a substrate. The gate structure includes one or more nanowires disposed between the source region and the drain region. The substrate includes a ridge section extending under the nanowires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
  a semiconductor substrate;
  a protruding structure formed on the semiconductor substrate; and
  a plurality of nanowires and one or more nano-vias formed in the protruding structure, the semiconductor substrate including a ridge section that extends under the protruding structure, the plurality of nanowires comprising a first nanowire and a second nanowire, the first nanowire of the plurality of nanowires being disposed closer to a major surface of the semiconductor substrate than the second nanowire of the plurality of nanowires, the second nanowire of the plurality of nanowires having a diameter greater than a diameter of the first nanowire of the plurality of nanowires.

2. The structure of claim 1, wherein
  each nanowire of the plurality of nanowires extends along a first direction, and
  the ridge section extends along the first direction.

3. The structure of claim 1, wherein the protruding structure includes a nanowire-shaped structure, a nanoslate, a nanorod, or a nanostructure disposed between pads.

4. The structure of claim 1, wherein
  the protruding structure has a width and a height,
  an aspect ratio of the protruding structure is equal to the height divided by the width, and
  the aspect ratio is larger than 1.

5. The structure of claim 1, wherein the protruding structure includes a sidewall corresponding to a shape of which a top width is larger than a bottom width.

6. The structure of claim 1, wherein the protruding structure includes (i) the plurality of nanowires, and (ii) dielectric material that surrounds each of the nanowires of the plurality of nanowires.

7. The structure of claim 6, wherein a thickness of the dielectric material is greater in a lower portion of the protruding structure than in an upper portion of the protruding structure.

8. A device comprising:
  a source region formed on a semiconductor substrate;
  a drain region formed on the semiconductor substrate; and
  a protruding structure including a plurality of nanowires and one or more nano-vias disposed between the source region and the drain region, wherein the semiconductor substrate includes a ridge section extending under each nanowire of the plurality of nanowires, wherein a first nano-via of the one or more nano-vias is disposed between a first nanowire and a second nanowire of the plurality of nanowires, the first nano-via of the one or more nano-vias being filled with air.

9. The device of claim 8, wherein the ridge section extends under the protruding structure.

10. The device of claim 9, wherein the protruding structure includes a nanowire-shaped structure, a nanoslate, a nanorod, or a nanostructure disposed between pads.

11. The device of claim 9, wherein
  the protruding structure has a width and a height,
  an aspect ratio of the protruding structure is equal to the height divided by the width, and
  the aspect ratio is larger than 1.

12. The device of claim 9, wherein the protruding structure includes a sidewall corresponding to a shape of which a top width is larger than a bottom width.

13. The device of claim 9, wherein the protruding structure includes (i) the plurality of nanowires, and (ii) dielectric material that surrounds each nanowire of the plurality of nanowires.

14. The device of claim 13, wherein a thickness of the dielectric material is greater in a lower portion of the protruding structure than in an upper portion of the protruding structure.

15. The device of claim 8,
  wherein each nanowire of the plurality of nanowires extends along a first direction, and
  the ridge section extends along the first direction.

16. A structure comprising:
  a semiconductor substrate; and
  a protruding structure formed on the semiconductor substrate and comprising (i) one or more nanowires, (ii) one or more nano-vias, and (iii) dielectric material that surrounds each nanowire of the one or more nanowires and each nano-via of the one or more nano-vias, a thickness of the dielectric material being greater in a lower portion of the protruding structure than in an upper portion of the protruding structure.

17. The structure of claim 16, wherein
the semiconductor substrate includes a ridge section that extends along the protruding structure,
each nanowire of the one or more nanowires extends along a first direction, and
the ridge section extends along the first direction.

18. The structure of claim 16, wherein the protruding structure includes a nanowire-shaped structure, a nanoslate, a nanorod, or a nanostructure disposed between pads.

19. The structure of claim 16, wherein
the protruding structure has a width and a height,
an aspect ratio of the protruding structure is equal to the height divided by the width, and
the aspect ratio is larger than 1.

20. The structure of claim 16, wherein the protruding structure includes a sidewall corresponding to a shape of which a top width is larger than a bottom width.

* * * * *